(12) United States Patent
Lindoff et al.

(10) Patent No.: US 7,986,930 B2
(45) Date of Patent: Jul. 26, 2011

(54) IQ IMBALANCE IMAGE SUPPRESSION IN PRESENCE OF UNKNOWN PHASE SHIFT

(75) Inventors: Bengt Lindoff, Bjärred (SE); Andres Reial, Malmö (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 608 days.

(21) Appl. No.: 11/949,481

(22) Filed: Dec. 3, 2007

(65) Prior Publication Data

US 2009/0036079 A1  Feb. 5, 2009

Related U.S. Application Data

(60) Provisional application No. 60/953,491, filed on Aug. 2, 2007.

(51) Int. Cl.
*H04B 1/10* (2006.01)
*H04K 3/00* (2006.01)

(52) U.S. Cl. .......................... 455/285; 455/302

(58) Field of Classification Search .......... 455/285, 455/296, 302; 375/346, 375
See application file for complete search history.

(56) References Cited

U.S. PATENT DOCUMENTS

| | | | |
|---|---|---|---|
| 6,442,217 B1 | 8/2002 | Cochran | |
| 6,515,980 B1 | 2/2003 | Bottomley | |
| 6,999,501 B1 | 2/2006 | Sawyer | |
| 7,010,278 B2 | 3/2006 | Kirschenmann et al. | |
| 7,035,341 B2 | 4/2006 | Mohindra | |
| 7,076,008 B2 | 7/2006 | Jeong | |
| 7,130,359 B2 | 10/2006 | Rahman | |
| 7,133,657 B2 | 11/2006 | Kuenen et al. | |
| 7,173,988 B2 | 2/2007 | Cochran et al. | |
| 7,177,372 B2 | 2/2007 | Gu | |
| 7,184,714 B1 * | 2/2007 | Kutagulla et al. | 455/73 |
| 7,190,733 B2 | 3/2007 | Sugar | |
| 7,242,730 B2 | 7/2007 | Kasperkovitz | |
| 2003/0007574 A1 | 1/2003 | Li et al. | |
| 2003/0072393 A1 | 4/2003 | Gu | |

(Continued)

FOREIGN PATENT DOCUMENTS

EP    1 416 691    3/2006

OTHER PUBLICATIONS

Cao, M. et al. "Parametric Modeling in Mitigating the I/Q Mismatch: Estimation, Equalization, and Performance Analysis." Annual Conference on Information Sciences and Systems, Mar. 2006, pp. 1286-1290.

(Continued)

*Primary Examiner* — Lee Nguyen
(74) *Attorney, Agent, or Firm* — Coates & Bennett PLLC (57) ABSTRACT

A wireless communication system receiver compensates a received signal containing an IQ gain imbalance prior to performing frequency correction. The IQ gain imbalance in the signal is estimated after frequency correction, providing an IQ gain imbalance estimate for subsequent IQ gain imbalance compensation. The IQ gain imbalance estimation includes formulating a plurality of hypotheses of phase error between I and Q signal components, and taking as the actual phase error the hypothesis that yields the maximum power ratio between I and Q signal components. The maximum power ratio is differentiated with respect to the IQ imbalance estimate. The IQ gain imbalance estimate is updated as a function of its prior value(s), the maximum power ratio, and the derivative of the maximum power ratio.

17 Claims, 4 Drawing Sheets

U.S. PATENT DOCUMENTS

| | | |
|---|---|---|
| 2003/0165203 A1 | 9/2003 | Mohindra |
| 2004/0095993 A1 | 5/2004 | Liu et al. |
| 2004/0165678 A1 | 8/2004 | Nadiri |
| 2005/0070236 A1 | 3/2005 | Paulus |
| 2005/0152476 A1 | 7/2005 | Coersmeier |
| 2005/0243218 A1 | 11/2005 | Yee et al. |
| 2006/0034218 A1 | 2/2006 | Ozluturk et al. |
| 2006/0153318 A1 | 7/2006 | Sugar |
| 2006/0229051 A1 | 10/2006 | Narayan et al. |
| 2006/0252399 A1 | 11/2006 | Paulus |
| 2006/0256216 A1 | 11/2006 | Takahito et al. |
| 2006/0270375 A1 | 11/2006 | Beamish et al. |
| 2006/0281411 A1 | 12/2006 | Isaac et al. |
| 2007/0081614 A1 | 4/2007 | Su |
| 2007/0097271 A1 | 5/2007 | Gao et al. |
| 2007/0116149 A1 | 5/2007 | Sugar |
| 2008/0095249 A1* | 4/2008 | Yoon et al. .................... 375/260 |

OTHER PUBLICATIONS

Lohtia, A. et al. "An Adaptive Digital Technique for Compensating for Analog Quadrature Modulator / Demodulator Impairments." IEEE Pacific Rim Conference on Communications, Computers and Signal Processing, May 1993, vol. 2, pp. 447-450.

Zhu, Z. et al. "Bias Analysis of a Gain/Phase/DC-Offset Estimation Technique for Direct Frequency Conversion Modulators." IEEE International Conference on Acoustics, Speech, and Signal Processing, Mar. 2005, vol. 3, pp. iii/825-iii/828.

Yu, J. et al. "A Novel Technique for I/Q Imbalance and CFO Compensation in OFDM Systems." IEEE International Symposium on Circuits and Systems, May 2005, vol. 6, pp. 6030-6033.

Yamaoka, A. et al. "A Novel Error Separation Technique for Quadrature Modulators and Demodulators." IEEE Radio and Wireless Symposium, Jan. 2007, pp. 563-566.

Xing, G. et al. "Frequency Offset and I/Q Imbalance Compensation for Direct-Conversion Receivers." IEEE Transactions on Wireless Communications, Mar. 2005, vol. 4, No. 2, pp. 673-680.

Yan, F. et al. "Carrier Frequency Offset Estimation for OFDM Systems with I/Q Imbalance." The 47th IEEE International Midwest Symposium on Circuits and Systems, Jul. 25-28, 2004, vol. 2, pp. II-633-II-636.

Tubbax, J. et al. "Joint Compensation of IQ Imbalance and Frequency Offset in OFDM Systems." Proceedings of Radio and Wireless Conference 2003 (RAWCON '03), Aug. 10-13, 2003, pp. 39-42.

Simoens, S. et al. "New I/Q Imbalance Modeling and Compensation in OFDM Systems with Frequency Offset." The 13th International Symposium on Personal, Indoor and Mobile Radio Communications 2002, Sep. 15-18, 2002, vol. 2, pp. 561-566.

Valkama, Mikko et al. "A Novel Image Rejection Architecture for Quadrature Radio Receivers." IEEE Transactions on Circuits and Systems II: Express Briefs, Feb. 2004, vol. 51, No. 2, pp. 61-68.

Yu, L. et al. "Novel Adaptive Mismatch Cancellation System for Quadrature IF Radio Receivers." IEEE Transactions on Circuits and systems II: Express Briefs, IEEE Service Center, New York, NY, US, vol. 46, No. 6, Jun. 1, 1999.

Lindoff, B. et al. "IQ Imbalance Image Suppression." Co-pending U.S. Appl. No. 11/832,695, filed Aug. 2, 2007.

Jui-Yuan Yu et al., A Novel Technique for I/Q Imbalance and CFO Compensation in OFDM Systems, Circuits and Systems, 2005, ISCAS 2005, IEEE International Symposium O N Kobe, Japan, May 23, 2005.

\* cited by examiner

IQ IMBALANCE IMAGE SUPPRESSION IN PRESENCE OF UNKNOWN PHASE SHIFT

This application claims priority to provisional patent application Ser. No. 60/953,491, filed Aug. 2, 2007, and incorporated herein by reference in its entirety.

FIELD OF THE INVENTION

The present invention relates generally to wireless communications, and in particular to suppressing IQ gain imbalance in the presence of unknown IQ phase shift.

BACKGROUND

Cellular wireless communication systems are well known in the art and widely deployed. The High Speed Packet Access (HSPA) Evolution track of Wideband CDMA (WCDMA) will provide dramatically increased data rates by combining multiple-antenna techniques and higher-order modulation. For example, in the downlink, 2×2 multiple-input, multiple-output (MIMO) transmission and 64-QAM modulation will be used, allowing up to triple the data rates achievable with current, single-antenna transmission and 16-QAM. It is expected that these peak data rates will be achievable in "good conditions," where the propagation channel-induced interference and interference from other external sources is low. Instead, the receiver front-end impairments are expected to become the limiting factors. Such impairments are particularly troublesome since their impact cannot be removed by means of power allocation or interference coordination. When the desired Signal to Interference Ratio (SIR) at the antenna is made high, the RF impairments will become the dominant disturbance and cause error floors and/or throughput ceilings. Some typical such impairments are IQ imbalance, phase noise, DC leakage, quantization and thermal noise, etc.

In order to take advantage of the MIMO and Higher Order Mode (HOM) features, it has been estimated that the overall receiver front-end output Signal to Noise Ratio (SNR) must be several dB higher, compared to that required for single-stream 16-QAM. Improving the quality of the RF circuitry in order to increase the output SNR increases the cost of the hardware considerably. This increase may be avoided or limited if the subsequent baseband processing stage could handle a lower-quality input signal, e.g. by performing additional operations to remove the impairment components.

In a typical cost-efficient RF circuit design, one important front-end impairment is the IQ imbalance. The IQ imbalance can originate at several points in the receiver, such as the local oscillator (LO) (at both the transmitter and the receiver); the variable-gain amplifier (VGA) chain; the analog to digital converter (ADC); and also due to variations in the cut-off frequency in the I and Q selectivity filters, giving rise to undesired signal images. The different IQ imbalance contributions accumulate coherently and hence may comprise one of the most dominant RF impairments. The impact of the IQ imbalance can be reduced to an acceptable level by utilizing an RF design with sufficient quality. However, a lower-quality but more cost-efficient RF front end may be used if the IQ imbalance image component could be removed or significantly reduced by baseband processing. Copending U.S. patent application Ser. No. 11/832,695, filed Aug. 2, 2007, titled "IQ Imbalance Image Suppression," assigned to the assignee of the present application, describes baseband IQ imbalance suppression, and is incorporated herein by reference in its entirety.

In many applications, a wireless communication system receiver has a frequency error, or mismatch, relative to the transmitted carrier frequency. The frequency error is tracked and corrected using Automatic Frequency Controller (AFC) technology, which is well known in the art. However, if the frequency correction is performed after the introduction of IQ imbalance, which is typically the case for correcting the residual frequency error (e.g., up to 100 Hz, which is typically corrected digitally), prior art IQ imbalance compensation techniques, such as those described in the above-referenced application, do not yield sufficient IQ imbalance suppression.

SUMMARY

According to one or more embodiments disclosed and claimed herein, a wireless communication system receiver IQ imbalance compensates a received signal containing an IQ gain imbalance prior to performing frequency correction. The IQ gain imbalance in the signal is estimated after frequency correction, providing an IQ gain imbalance estimate for subsequent IQ gain imbalance compensation. The IQ gain imbalance estimation includes formulating a plurality of hypotheses of phase error between I and Q signal components, and taking as the actual phase error the hypothesis that yields the maximum power ratio between I and Q signal components.

One embodiment relates to a method of compensating for IQ gain imbalance in a received wireless communication signal, the received signal including in-phase (I) and quadrature (Q) signal components. A wireless communication signal having a gain imbalance and an unknown phase error between I and Q components and a frequency error between transmitter and receiver carrier frequencies is received. Gain compensation is performed on at least one of the I and Q signal components using the most recently computed IQ gain imbalance estimate. After the gain compensation, frequency correction is performed on the signal. After the frequency correction, the IQ gain imbalance estimate is updated. The updated IQ gain imbalance estimate is used to perform gain compensation on a successively received portion of the signal.

Another embodiment relates to a method of successively estimating the IQ gain imbalance in a received signal by a wireless communication system receiver, following frequency correction of the signal. A plurality of hypotheses of a phase error between I and Q components of the received signal is formulated. The power ratio between I and Q components is estimated for each phase hypothesis. The maximum power ratio over all phase hypotheses is determined. The maximum power ratio is differentiated with respect to the IQ gain imbalance. A new IQ gain imbalance estimate is then generated based on a prior IQ gain imbalance estimate, the maximum power ratio, and the derivative of the maximum power ratio.

Yet another embodiment relates to a wireless communication system receiver. The receiver includes memory operative to store an IQ gain imbalance estimate. The receiver also includes a first frequency correction unit receiving a communication signal, and operative to correct the signal for a known frequency error and to output a frequency-corrected signal. The receiver further includes a phase hypothesis unit receiving the frequency-corrected signal, and operative to formulate a plurality of hypotheses of a phase error between I and Q components of the frequency-corrected signal, and further operative to output a corresponding plurality of hypothesized signals, each assuming one of the plurality of phase hypotheses. The receiver also includes a controller operative to access the memory and receiving the plurality of hypothesized signals, the controller further operative to determine the maximum power ratio between I and Q components over all phase hypotheses, differentiate the maximum power ratio with respect to an IQ gain imbalance estimate, and generate and output an updated IQ gain imbalance estimate as a function of a prior IQ gain imbalance estimate, the maximum power ratio, and the derivative of the maximum power ratio.

DETAILED DESCRIPTION

Figure 1:
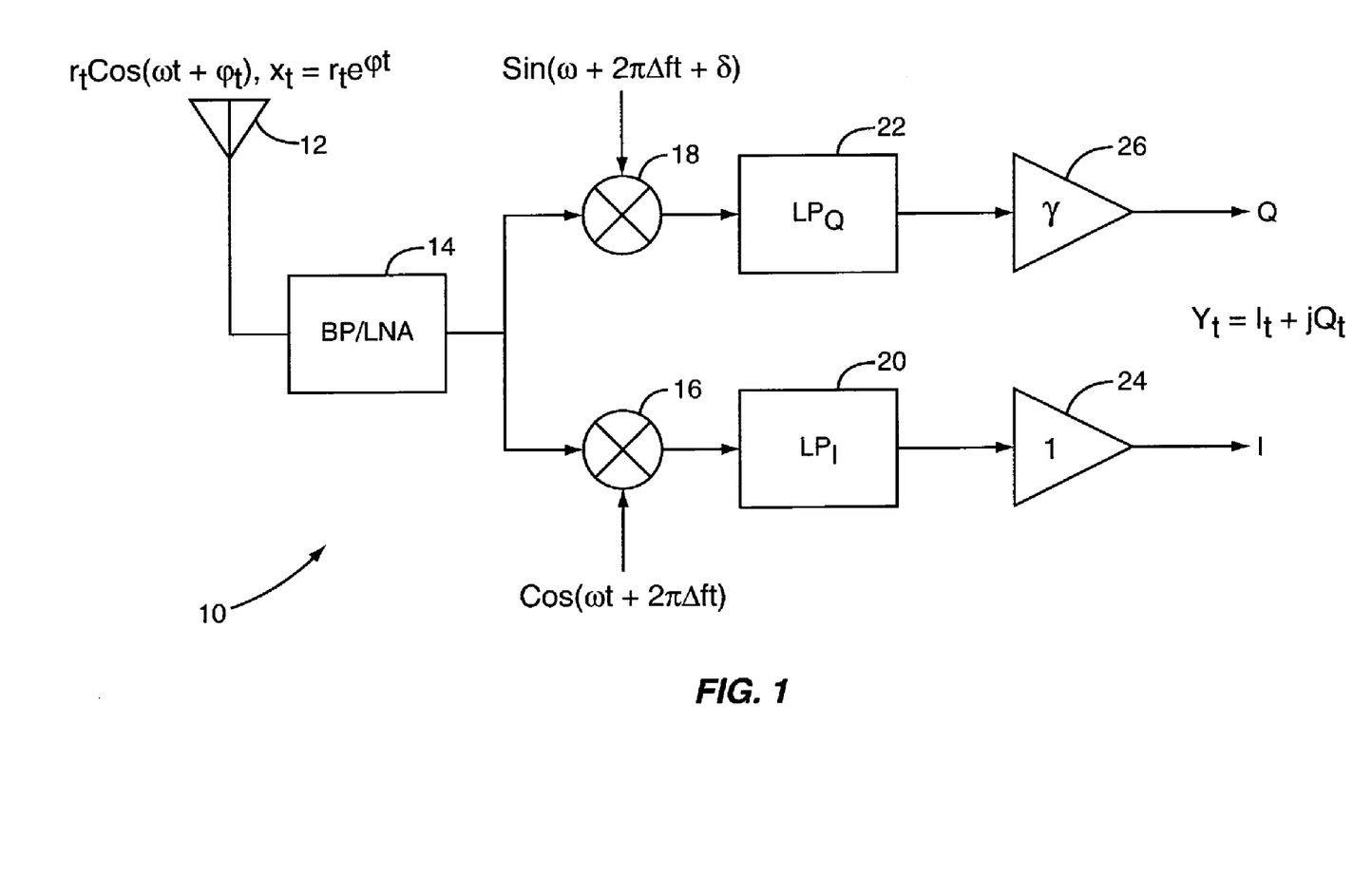
FIG. 1 is a functional block diagram of a receiver depicting sources of IQ imbalance.

FIG. 1 depicts an RF receiver 10 demonstrating several sources of IQ imbalance. The transmitted signal $x_t$, received at the antenna 12, may be modeled as $r_t e^{\Phi_t}$ or $r_t \cos(\omega t + \phi_t)$ where the term $\phi_t$ represents an error in the transmitter LO which contributes to IQ imbalance. The received signal is front-end processed by the band-pass filter and low noise amplifier 14, and In-phase (I) and Quadrature (Q) signal components are separated by multiplying by phase-offset periodic signals from the receiver LO at multipliers 16, 18. A phase imbalance in the LO signals, represented by the $\delta$ term in $\sin(\omega t + \delta)$ also contributes to IQ imbalance. Further IQ imbalance may be contributed by cut-off frequency variations in the I and Q low-pass filters 20, 22, and still further IQ imbalance may arise from a gain imbalance $\gamma$ in the I and Q VGAs 24, 26. As depicted in FIG. 1, the complex output signal $y_t$ may be expressed in terms of its In-phase and Quadrature components, $I_t + jQ_t$. Note that this signal includes the collective IQ imbalance from the sources discussed above.

Using the notation defined above, the image rejection ratio (IRR)—a performance measure traditionally used to characterize the impact of IQ imbalance—is calculated as $$IRR = \left| \frac{1 + \gamma e^{-j\delta}}{1 - \gamma e^{j\delta}} \right|^2 \quad (1)$$

Due to the linear nature of the IQ imbalance mechanism, the contributions of the transmitter and the various receiver stages, as depicted in FIG. 1, may be lumped together into a single term and treated jointly. IQ imbalances add as amplitudes, i.e., two IQ imbalance sources with 30 dB image rejection each give rise to a total (worst case, if the imbalances have same direction) 24 dB image rejection. In a typical RF architecture, the phase imbalance $\delta$ is smaller (yielding IRR<−30 dB) than the gain imbalance $\gamma$ (worst case IRR~24 dB). Thus, it is most important to estimate and compensate for the gain imbalance $\gamma$.

Also, in a practical receiver 10, the LO carrier frequency often is not perfectly matched to the transmitted carrier frequency. Accordingly, a small frequency error $\Delta f$ (typically <100 Hz) is introduced, as depicted in FIG. 1. Since $\Delta f$ is known, the received signal can be frequency corrected, or derotated, prior to the gain estimate, to remove the phase drift over time. However, the exact absolute phase cannot be determined and removed.

Figure 2:
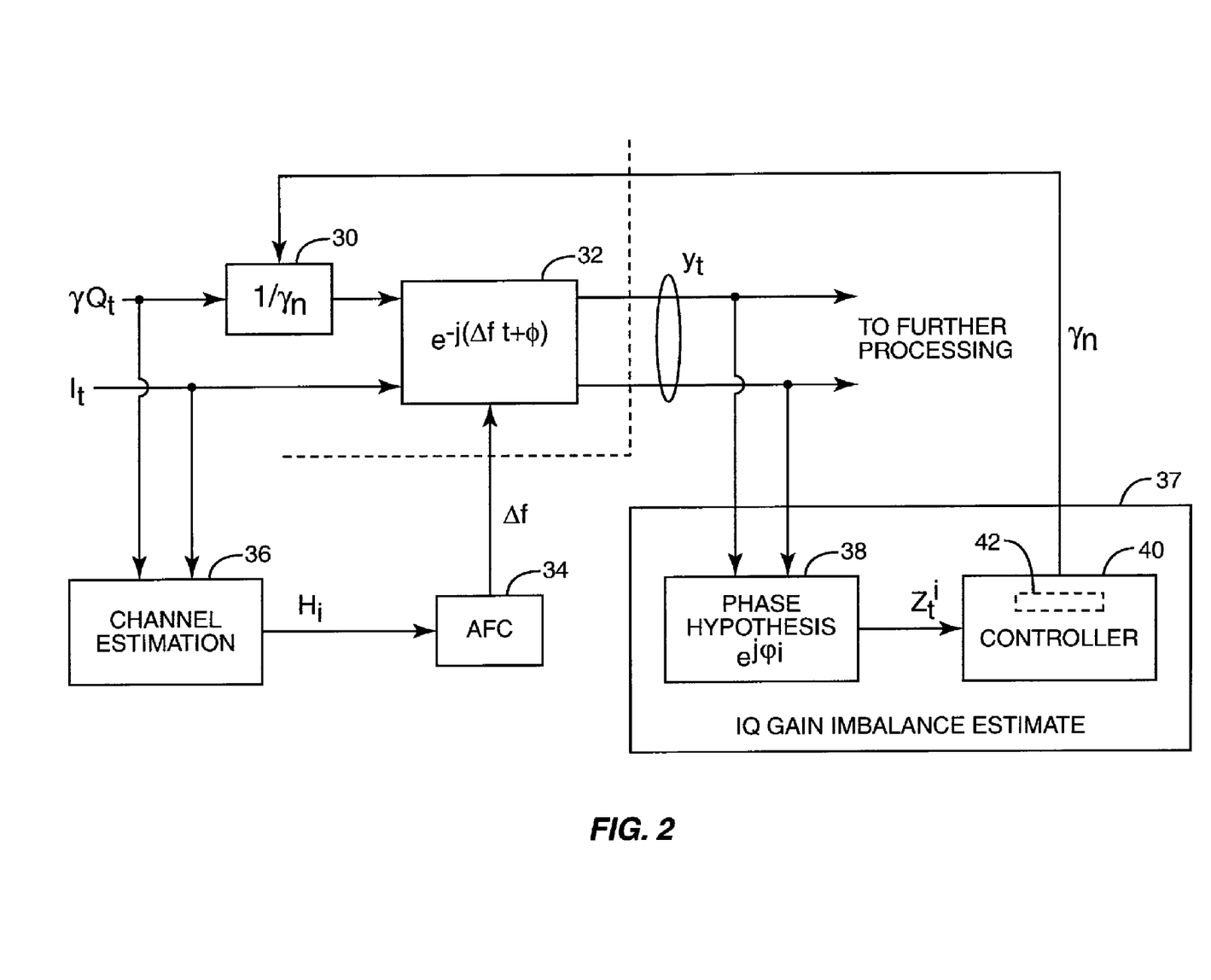
FIG. 2 is a functional block diagram of a receiver performing IQ gain imbalance estimation after frequency correction.

FIG. 2 depicts a functional block diagram of the receiver 10. The Gain Compensation Unit 30 performs IQ gain imbalance compensation—in the embodiment depicted, on the Q component of the received signal—prior to frequency correction of the signal in the Frequency Correction Unit 32. The IQ gain imbalance estimation is performed after the frequency compensation, in an IQ Gain Imbalance Estimation Unit 37 comprising a Phase Hypothesis Unit 38 and Controller 40 accessing memory 42. The reason for this order of operation is that, in a typical User Equipment (UE) receiver, the gain compensation and frequency correction are performed in (typically analog) RF circuits of the UE and the estimation is performed in (typically digital) baseband processing circuits. These circuits may be implemented in separate integrated circuit components, as depicted by the dashed line in FIG. 2.

The frequency error $\Delta f$ is estimated in an Automated Frequency Controller Unit 34, based on channel estimates $H_i$ provided by a channel estimation unit 36 receiving the received communication signal, and is provided to the Frequency Correction Unit 32. Assuming a small frequency error, the impact of $\Delta f$ can be approximated as a certain constant phase rotation $\phi$ over a small set of samples. The phase $\phi$ is typically not known in the IQ Gain Imbalance Estimation Unit 37. According to one or more embodiments of the present invention, a number of phase hypotheses $\phi_i$ are formulated in the Phase Hypothesis Unit 38, and signals assuming each of the hypothetical phase errors $\phi_i$ are analyzed in the Controller 40. Mathematically, if the received signal after frequency error correction is $y_t$ then $$z_t^i = e^{-j\phi_i} y_t, i = 1, \ldots, m \quad (2)$$

where $z_t^i$ is the signal assuming phase hypothesis $\phi_i$. In the case of a known phase $\phi_i$, an IQ gain imbalance estimate may be derived by estimating the power ratio of I and Q signal components over a number of chip samples (corresponding to, e.g., ½ to 2 slots). The IQ gain imbalance is then proportional to the square root of the power ratio.

If the phase $\phi$ is not known, the power ratio $Q_i$ is estimated for each phase hypothesis, and the ratios are compared to determine the phase hypothesis yielding the maximum ratio $M_n$. That is, $$Q_i = \frac{\mathrm{Var}(\mathrm{real}(z_t^i))}{\mathrm{Var}(\mathrm{imag}(z_t^i))} \quad (3)$$

$$M_n = \max_i Q_i \quad (4)$$

where the index n is related to the power estimate at the $n^{th}$ measurement time.

The derivative of maximum power ratio $M_n$ with respect to the IQ gain imbalance is then estimated as $$\frac{dM_n}{d\gamma_n} = \frac{M_n - M_{n-1}}{\gamma_{n-1} - \gamma_{n-2}} \quad (5)$$

and the IQ gain imbalance estimate is updated using the maximum power ratio $M_n$ and its derivative:

$$\gamma_n = \gamma_{n-1} \cdot \sqrt{M_n}^{sign\left(\frac{dM_n}{d\gamma_n}\right)} \quad (6)$$

These calculations are performed in the Controller 40. The prior values of the IQ gain imbalance estimate $\gamma_{n-1}, \gamma_{n-2}$, etc. and the maximum power ratio $M_{n-1}$ may be stored in the memory 42, which may comprise part of the Controller 40, as depicted in FIG. 2, or may be externally accessed by the Controller 40. Note that the equations above provide a specific example of one embodiment of IQ gain imbalance estimation following frequency correction. However, the present invention is not limited to this embodiment. In general, the IQ gain imbalance estimate may be calculated in numerous ways, as a function of $\gamma_{n-k}, k=1, 2, \ldots$ and the values of $$M, \frac{dM}{d\gamma}.$$

Figure 3:
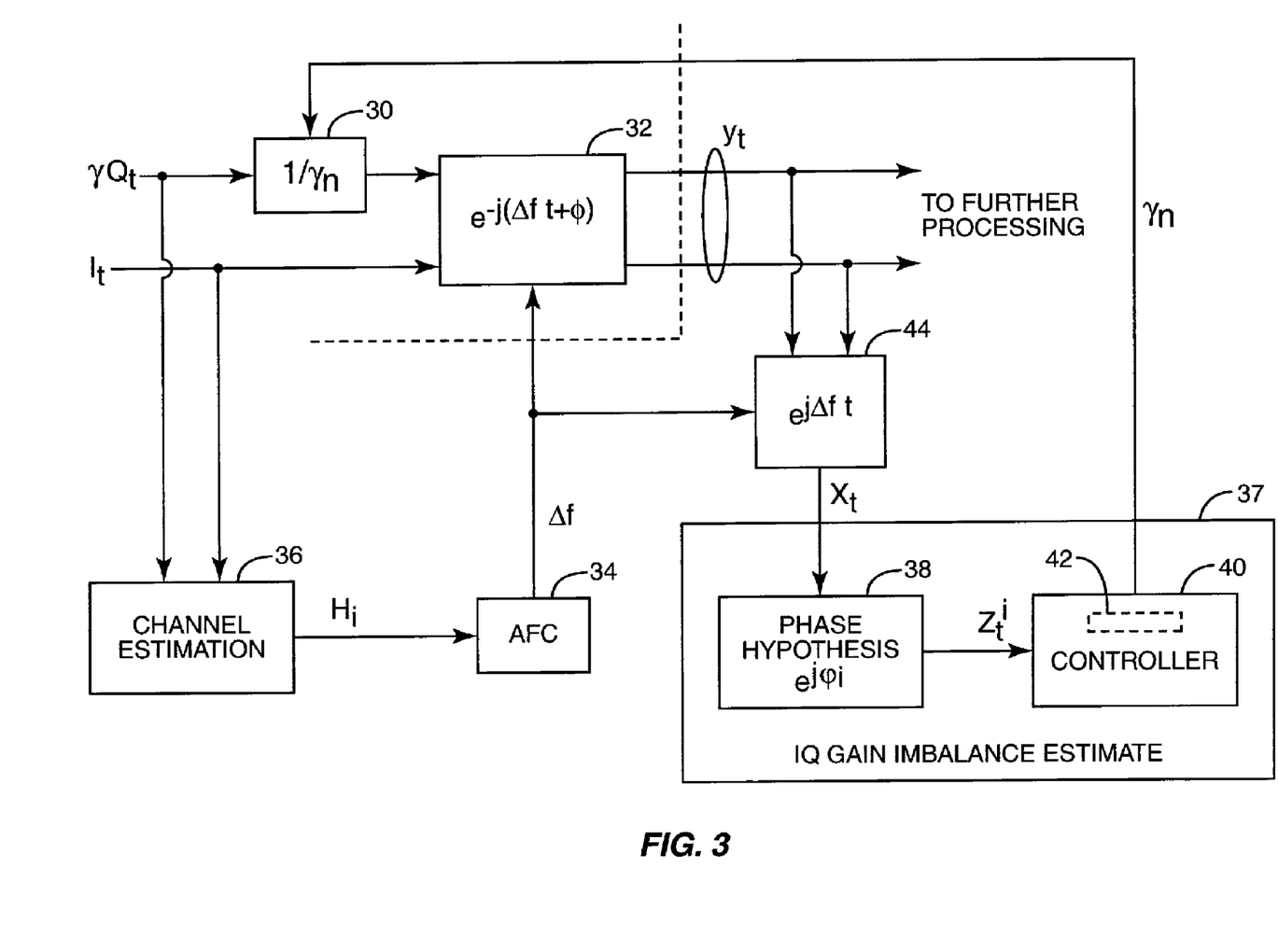
FIG. 3 is a functional block diagram of a receiver performing IQ gain imbalance estimation after frequency correction, where the previous frequency correction is eliminated for imbalance estimation purposes.

FIG. 3 depicts an embodiment that is advantageous when the frequency error is large relative to the time over which samples are taken for determining the power ratio. In this case, the frequency error could be assumed to be approximated with a constant phase. This will be the case, for example, when taking more than one slot data, and having a frequency error larger than 200 Hz. In this case the residual frequency error is too large to track the proper phase of the imbalance correction. Accordingly, in this case the frequency correction performed in the RF stage at block 32 is removed at block 44. This yields a signal $x_t$ with constant phase error but no rotation:

$$x_t = y_t e^{j\Delta ft}. \quad (7)$$

To determine the correct phase for IQ gain imbalance estimation, phase error hypotheses are formulated as described above, yielding $$z_t^i = e^{-j\phi_i} x_t, i=1, \ldots, m \quad (8)$$

where $z_t^i$ is the signal assuming phase hypothesis $\phi_i$.

Figure 4:
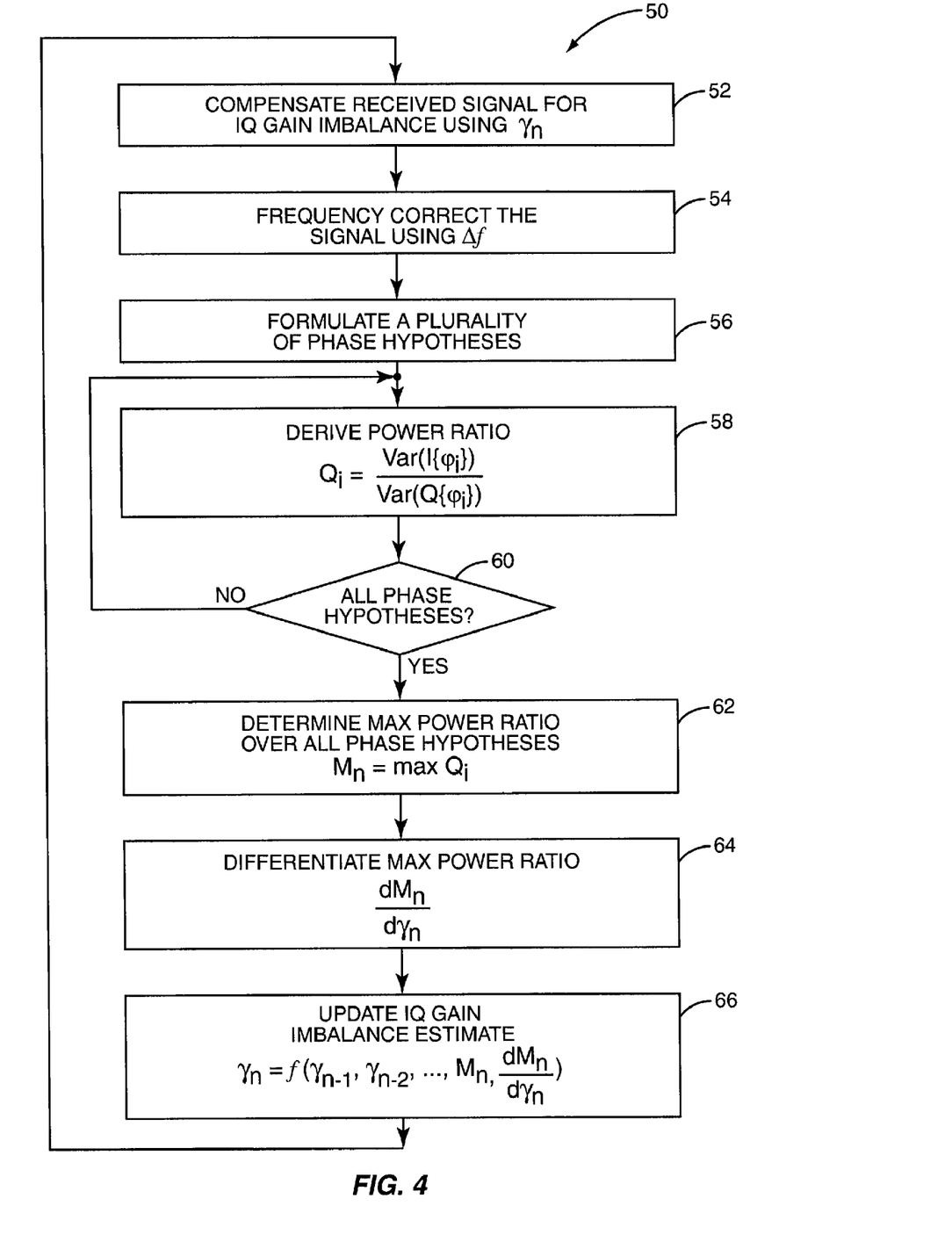
FIG. 4 is a flow diagram of a method of calculating an IQ gain imbalance estimate for a frequency-corrected signal.

The flow diagram of FIG. 4 depicts a method 50 of compensating a received communication signal for IQ gain imbalance, according to one or more embodiments of the present invention. Those of skill in the art will recognize that the method 50 is an iterative one, and is continuously performed. However, for the purpose of explication, the method may be said to "begin" when a newly received signal is compensated for IQ gain imbalance, based on the most recent IQ gain imbalance estimate (block 52). The signal is then frequency corrected for a known frequency error, such as $\Delta f$ computed by an AFC unit 34 (block 54).

Following frequency correction, the IQ gain imbalance is estimated. Since the phase error between I and Q signal components is unknown, a plurality of phase hypotheses are formulated (block 56). The power ratio between the I and Q signal components is derived (block 58) for each phase hypothesis (block 60). The maximum power ratio over all phase hypotheses is then determined (block 62), and its derivative with respect to the IQ gain imbalance estimate is calculated (block 64). The IQ gain imbalance estimate is then updated as a function of its prior value, the maximum power ratio, and the derivative of the maximum power ratio (block 68). The updated IQ gain imbalance estimate is then used to compensate the received signal for IQ gain imbalance (block 52) prior to frequency correction (block 54), and the method repeats.

Those of skill in the art will understand that FIGS. 2 and 3 depict functional units, each of which implements a particular function. These units may be implemented in various embodiments as electronic circuits, software modules executing on a stored-program processor or digital signal processor (DSP), or firmware comprising various blends of circuits and software. Furthermore, the electrical circuits may be integrated or discrete, and the implementation of functionality into circuits or software may not follow the functional divisions depicted in the figures. The memory 42 accessed by the controller 40 may comprise one or more registers or latches, RAM (DRAM, SRAM, SDRAM, or the like), flash memory, EEPROM, or any other read/write memory technology known in the art. The memory 42 may reside within the controller 40 as depicted, or it may alternatively reside external to the controller 40, with access across a memory bus, as well known in the art.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A method of compensating for IQ gain imbalance in a received wireless communication signal, the received signal including in-phase (I) and quadrature (Q) signal components, comprising:
   receiving a wireless communication signal having a gain imbalance and an unknown phase error between I and Q components and a frequency error between transmitter and receiver carrier frequencies;
   performing gain compensation on at least one of the I and Q signal components using the IQ gain imbalance estimate most recently computed from an earlier received portion of the wireless communication signal;
   after the gain compensation, performing frequency correction on the wireless communication signal;
   after the frequency correction, updating the IQ gain imbalance estimate based on the received wireless communication signal; and
   using the updated IQ gain imbalance estimate to perform gain compensation on a successively received portion of the wireless communication signal.

2. The method of claim 1 wherein updating the IQ gain imbalance estimate based on the received wireless communication signal comprises formulating a plurality of hypotheses of phase error between the I and Q components of the wireless communication signal.

3. The method of claim 2 wherein updating the IQ gain imbalance estimate further comprises estimating the power ratio between I and Q components of the wireless communication signal for each phase hypothesis, and determining the maximum such power ratio.

4. The method of claim 3 wherein updating the IQ gain imbalance estimate further comprises estimating the derivative of the maximum power ratio with respect to the IQ gain imbalance, and updating the IQ gain imbalance estimate as a function of its prior value, the maximum power ratio, and the derivative of the maximum power ratio.

5. The method of claim 4 wherein
   a plurality of signals assuming the plurality of phase error hypotheses is $$z_t^i = e^{-j\phi_i} y_t, i=1, \ldots, m$$

where $y_t$ is the received signal after the frequency compensation and $\phi_i$, is the $i^{th}$ phase hypothesis;
the power ratio $Q_i$ for the $i^{th}$ phase hypothesis is $$Q_i = \frac{\text{Var}(real(z_t^i))}{\text{Var}(imag(z_t^i))};$$

the maximum power ratio $M_n$ over all phase hypotheses is $$M_n = \max_i Q_i;$$

the derivative of the maximum power ratio $M_n$ with respect to the IQ gain imbalance is $$\frac{dM_n}{d\gamma_n} = \frac{M_n - M_{n-1}}{\gamma_{n-1} - \gamma_{n-2}}; \text{ and}$$

the updated IQ gain imbalance estimate $\gamma_n$ is $$\gamma_n = \gamma_{n-1} \cdot \sqrt{M_n}^{sign\left(\frac{dM_n}{d\gamma_n}\right)}.$$

6. The method of claim 2 wherein, for frequency errors in the received signal in excess of a predetermined threshold, performing frequency correction on the signal comprises removing the correction for estimation purposes.

7. The method of claim 6 wherein the signal is first frequency corrected with an assumed constant phase to yield the signal $y_t$, and is subsequently un-corrected to obtain the signal $$x_t = y_t e^{j\Delta ft}.$$

8. The method of claim 2 wherein the phase error hypotheses yield $$z_t^i = e^{-j\phi_i} x_t, i = 1, \ldots, m$$

where $z_t^i$ is the signal assuming phase hypothesis $\phi_i$.

9. A method of successively estimating the IQ gain imbalance in a wireless communication signal received by a wireless communication system receiver, following frequency correction of the wireless communication signal, comprising:
formulating a plurality of hypotheses of a phase error between I and Q components of the received wireless communication signal;
estimating the power ratio between I and Q components for each phase hypothesis;
determining the maximum power ratio over all phase hypotheses;
differentiating the maximum power ratio with respect to the IQ gain imbalance; and
generating a new IQ gain imbalance estimate for the wireless communication signal based on a prior IQ gain imbalance estimate derived from the wireless communication signal, the maximum power ratio, and the derivative of the maximum power ratio.

10. The method of claim 9 further comprising correcting the received wireless communication signal for frequency error prior to formulating the phase error hypotheses.

11. The method of claim 10 further comprising using the new IQ gain imbalance estimate to gain compensate at least one of the I and Q signal components prior to performing frequency correction on the received wireless communication signal.

12. A wireless communication system receiver, comprising:
memory operative to store an IQ gain imbalance estimate derived from a wireless communication signal received by the receiver;
a first frequency correction unit operative to receive a wireless communication signal, and operative to correct the wireless communication signal for a known frequency error and to output a frequency-corrected wireless communication signal;
a phase hypothesis unit operative to receive the frequency-corrected wireless communication signal, and operative to formulate a plurality of hypotheses of a phase error between I and Q components of the frequency-corrected wireless communication signal, and further operative to output a corresponding plurality of hypothesized wireless communication signals, each assuming one of the plurality
a controller operative to access the memory and receiving the plurality of hypothesized wireless communication signals, the controller further operative to determine the maximum power ratio between I and Q components over all phase hypotheses,
differentiate the maximum power ratio with respect to an IQ gain imbalance estimate, and
generate and output an updated IQ gain imbalance estimate as a function of a prior IQ gain imbalance estimate derived from a received wireless communication signal, the maximum power ratio, and the derivative of the maximum power ratio.

13. The receiver of claim 12 further comprising:
a gain compensation unit upstream of the first frequency correction unit, the gain compensation unit operative to compensate at least one of I and Q components of a received wireless communication signal for the most recent IQ gain imbalance estimate derived from a received wireless communication signal.

14. The receiver of claim 12 wherein the first frequency correction unit and gain compensation unit are disposed in an RF front-end circuit and the phase hypothesis unit, controller, and memory are disposed in a baseband processing circuit.

15. The receiver of claim 14 wherein the RF front-end circuit is analog and the baseband processing circuit is digital.

16. The receiver of claim 12 further comprising:
a channel estimation unit operative to receive the wireless communication signal and operative to derive and output estimates of the transmission channel; and
an Automatic Frequency Compensation (AFC) unit operative to receive channel estimates and operative to calculate and output to the first frequency correction unit an indication of frequency error between a wireless transmitter and the receiver.

17. The receiver of claim 12 further comprising a frequency un-correction unit interposed between the first frequency correction unit and the phase hypothesis unit, the frequency un-correction unit operative to remove the correction value applied by the first frequency correction unit.

* * * * *

UNITED STATES PATENT AND TRADEMARK OFFICE
CERTIFICATE OF CORRECTION

| | | |
|---|---|---|
| PATENT NO. | : 7,986,930 B2 | Page 1 of 1 |
| APPLICATION NO. | : 11/949481 | |
| DATED | : July 26, 2011 | |
| INVENTOR(S) | : Lindoff et al. | |

It is certified that error appears in the above-identified patent and that said Letters Patent is hereby corrected as shown below:

On the Title Page, item (74), under "Attorney, Agent, or Firm", in Column 2, Line 1, delete "Coates" and insert -- Coats --, therefor.

In Column 5, Lines 63-64, delete "(block 68)." and insert -- (block 66). --, therefor.

In Column 8, Line 23, in Claim 12, delete "plurality" and insert -- plurality of phase hypotheses; and --, therefor.

Signed and Sealed this
Fourteenth Day of February, 2012

David J. Kappos
*Director of the United States Patent and Trademark Office*